US007338888B2

(12) United States Patent
Lu et al.

(10) Patent No.: US 7,338,888 B2
(45) Date of Patent: Mar. 4, 2008

(54) METHOD FOR MANUFACTURING A SEMICONDUCTOR DEVICE HAVING A SILICIDED GATE ELECTRODE AND A METHOD FOR MANUFACTURING AN INTEGRATED CIRCUIT INCLUDING THE SAME

(75) Inventors: Jiong-Ping Lu, Richardson, TX (US); Haowen Bu, Plano, TX (US); Shaofeng Yu, Plano, TX (US); Ping Jiang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 114 days.

(21) Appl. No.: 10/810,759

(22) Filed: Mar. 26, 2004

(65) Prior Publication Data

US 2005/0215037 A1 Sep. 29, 2005

(51) Int. Cl.
*H01L 21/28* (2006.01)
*H01L 21/44* (2006.01)
*H01L 21/76* (2006.01)
*H01L 21/4763* (2006.01)

(52) U.S. Cl. ...................... 438/583; 438/592; 438/649; 438/651

(58) Field of Classification Search ................ 438/583, 438/592, 649, 651, 656, 683, 231, 581, 663
See application file for complete search history.

(56) References Cited

U.S. PATENT DOCUMENTS 5,545,581 A * 8/1996 Armacost et al. ........... 438/631
6,096,609 A * 8/2000 Kim et al. .................. 438/281
6,376,320 B1 * 4/2002 Yu ............................ 438/303
6,423,634 B1 * 7/2002 Wieczorek et al. ......... 438/655
6,514,859 B1 * 2/2003 Erhardt et al. .............. 438/682
6,555,453 B1 * 4/2003 Xiang et al. ................ 438/581
6,562,718 B1 * 5/2003 Xiang et al. ................ 438/682
6,620,718 B1 * 9/2003 Wieczorek et al. ......... 438/592
6,821,887 B2 * 11/2004 Wieczorek et al. ......... 438/664
6,830,987 B1 * 12/2004 Pelella et al. ............... 438/421
6,864,178 B1 * 3/2005 Kim ........................... 438/692
2005/0215055 A1 * 9/2005 Bu et al. .................... 438/682

OTHER PUBLICATIONS

Jakub Kedzierski, et al.; "Issues in NiSi-Gated FDSOI Device Integration"; 2003 IEEE.

* cited by examiner

*Primary Examiner*—Chuong Anh Luu
(74) *Attorney, Agent, or Firm*—W. James Brady, III; Frederick J. Telecky, Jr.

(57) ABSTRACT

The present invention provides a method for manufacturing a semiconductor device and a method for manufacturing an integrated circuit including the semiconductor device. The method for manufacturing the semiconductor device (100), among other possible steps, includes forming a polysilicon gate electrode over a substrate (110) and forming source/drain regions (170) in the substrate (110) proximate the polysilicon gate electrode. The method further includes forming a blocking layer (180) over the source/drain regions (170), the blocking layer (180) comprising a metal silicide, and siliciding the polysilicon gate electrode to form a silicided gate electrode (150).

16 Claims, 13 Drawing Sheets

100
130
168
160
150
163
180
180
140
170
170
120
110

200
310
330
260
250
240
220
320
230
210

METHOD FOR MANUFACTURING A SEMICONDUCTOR DEVICE HAVING A SILICIDED GATE ELECTRODE AND A METHOD FOR MANUFACTURING AN INTEGRATED CIRCUIT INCLUDING THE SAME

TECHNICAL FIELD OF THE INVENTION

The present invention is directed, in general, to a method for manufacturing a semiconductor device and, more specifically, to a method for manufacturing a semiconductor device having a silicided gate electrode and a method for manufacturing an integrated circuit including the same.

BACKGROUND OF THE INVENTION

Metal gate electrodes are currently being investigated to replace polysilicon gate electrodes in today's ever shrinking and changing transistor devices. One of the principle reasons the industry is investigating replacing the polysilicon gate electrodes with metal gate electrodes is in order to solve problems of poly-depletion effects and boron penetration for future CMOS devices. Traditionally, a polysilicon gate electrode with an overlying silicide was used for the gate electrodes in CMOS devices. However, as device feature size continues to shrink, poly depletion becomes a serious issue when using polysilicon gate electrodes.

Accordingly, metal gates have been proposed. However, in order to optimize the threshold voltage ($V_t$) in CMOS devices, the metal gates need dual tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, *IEEE Intl. SOI Conf. Proc.*, pp. 91-92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process and avoids contamination issues. Furthermore, poly doping has been shown to affect the work function of the silicided metal gates.

The silicided metal gates are not without their problems. One of the more significant problems associated with the silicided metal gates is attributed to the simultaneous formation of the silicided metal gate and the silicided source/drain regions. When formed simultaneously, the depth of the silicided source/drain regions is directly proportional to the thickness of the polysilicon gate electrode. As the polysilicon gate electrodes currently range in thickness from about 60 nm to about 120 nm, the silicided source/drain regions ultimately extend into the silicon substrate by up to about 60 nm to about 120 nm, respectively. Deep silicided source/drain regions are nonetheless undesirable.

Various companies in the industry have attempted to separate the silicidation of the polysilicon gate and the silicidation of the source/drain regions. Those companies employ chemical mechanical polishing (CMP) technology to separate the steps. In such integration schemes, the gate electrode is masked by a silicon oxide layer and a silicide is then formed on the source/drain regions. Next, a blanket dielectric layer is deposited over the gate stack and silicided source/drain regions. The CMP process is then employed to expose the gate electrode for silicidation, while the source/drain regions are covered by the protective dielectric layer. The main drawback of this approach originates from the across-wafer non-uniformity inherently associated with polishing (such as dishing, etc.). In addition, the poly height on the active area may be different from the designed poly height. As a result, the height of the poly gate after polishing may suffer significant variation. Therefore, the silicidation may be inconsistent across-wafer, and/or wafer-to-wafer due to the thickness variation in poly-gate.

Accordingly, what is needed is a method for manufacturing silicided metal gate structures separate from the silicided source/drain regions that does not experience the drawbacks of the prior art methods.

SUMMARY OF THE INVENTION

To address the above-discussed deficiencies of the prior art, the present invention provides a method for manufacturing a semiconductor device and a method for manufacturing an integrated circuit including the semiconductor device. The method for manufacturing the semiconductor device, among other possible steps, includes forming a polysilicon gate electrode over a substrate and forming source/drain regions in the substrate proximate the polysilicon gate electrode. The method further includes forming a blocking layer over the source/drain regions, the blocking layer comprising a metal silicide, and siliciding the polysilicon gate electrode to form a silicided gate electrode.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
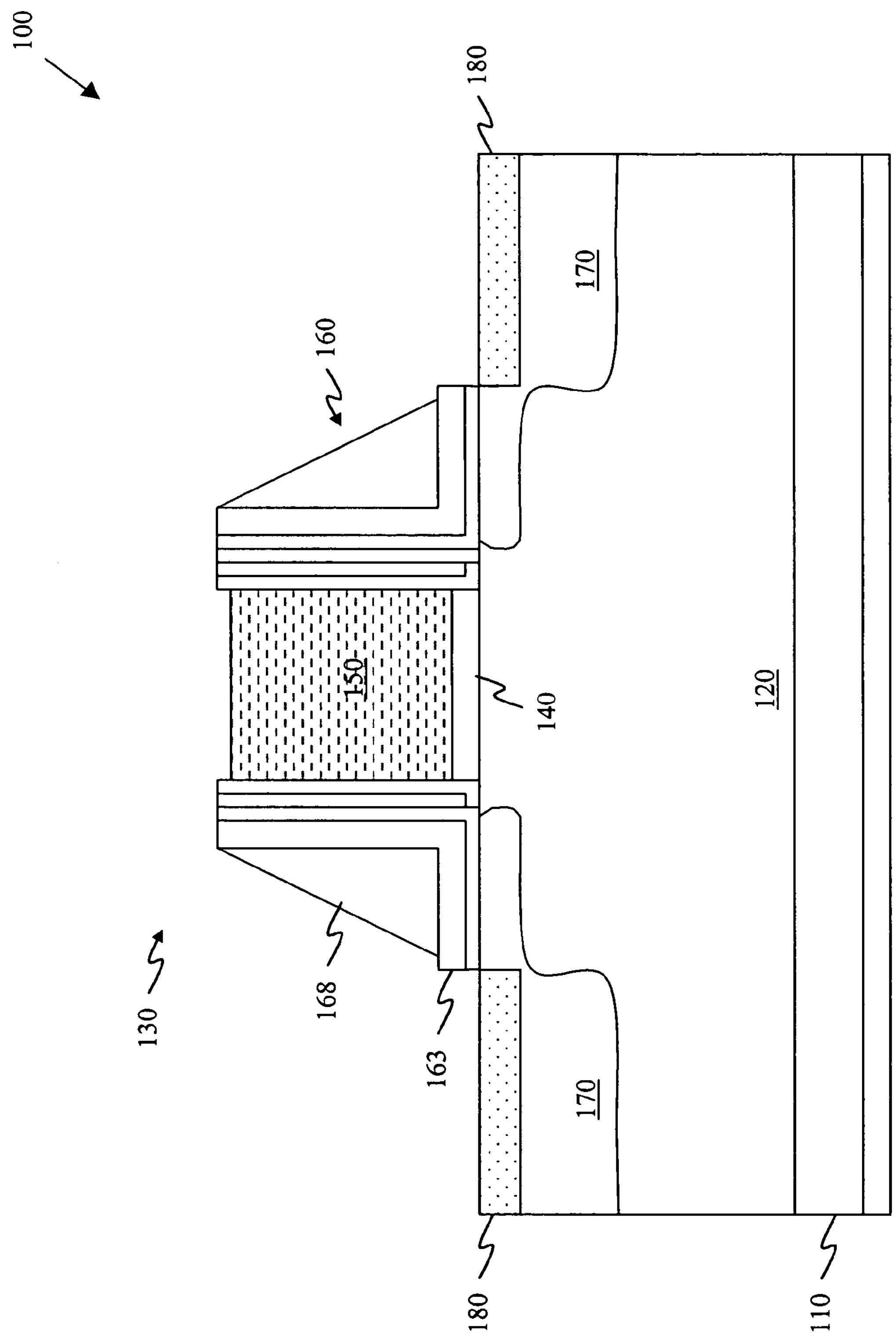
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a substrate 110. Located within the substrate 110 in the embodiment of FIG. 1 is a well region 120. Additionally located over the substrate 110 and well region 120 is a gate structure 130.

The gate structure 130 illustrated in FIG. 1 includes a gate oxide 140 located over the substrate 110, as well as a silicided gate electrode 150 located over the gate oxide 140. While the silicided gate electrode is illustrated in FIG. 1 as a fully silicided gate electrode, those skilled in the art understand that the silicided gate electrode 150 could also comprise a partially silicided gate electrode where only the top portion of the electrode is silicided. This embodiment might be used if there was a need to reduce the contact resistance of the silicided gate electrode 150.

The silicided gate electrode 150 may have a variety of thicknesses, nonetheless, a thickness ranging from about 50 nm to about 150 nm is exemplary. The silicided gate electrode 150, when constructed in accordance with the principles of the present invention, may comprise a number of different materials. For instance, in the illustrative embodiment shown in FIG. 1 the silicided gate electrode 150 comprises nickel, however, it is envisioned that the silicided gate electrode 150 could comprise cobalt, platinum, titanium, tantalum, molybdenum, tungsten, etc., while staying within the scope of the present invention.

The silicided gate electrode 150 may also include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so called work function.

The gate structure 130 further contains gate sidewall spacers 160 flanking both sides of the silicided gate electrode 150 and gate oxide 140. The gate sidewall spacers 160 in the embodiment of FIG. 1 each include a number of different layers. For instance the gate sidewall spacers 160, among other layers, each include L-shaped nitride spacers 163 and sidewall oxides 168. In this particular embodiment the L-shaped nitride spacers 163 comprise a unique nitride layer that includes carbon. The carbon content may be within a wide range, however, it is believed that a carbon content ranging from about 5% to about 10% is advantageous. The other layers, among other materials, could include a collection of oxides and nitrides. The gate sidewall spacers 160 may comprise many different types and numbers of layers while staying consistent with the principles of the present invention.

The semiconductor device 100 illustrated in FIG. 1 additionally includes conventional source/drain regions 170 located within the substrate 110 and proximate the gate oxide 140. Located within the source/drain regions 170 are blocking layers 180. The blocking layers 180 in the embodiment of FIG. 1 function both as a protectant from the silicidation material used to form the silicided gate electrode 150, as well as source/drain contact regions.

The blocking layers 180, when manufactured in accordance with the principles of the present invention, comprise a metal silicide. In one embodiment, the blocking layers 180 comprise a metal silicide different from the metal silicide of the silicided gate electrode 150, however, in another embodiment they comprise a metal silicide the same as the metal silicide of the silicided gate electrode 150. As the silicided gate electrode 150 in the embodiment of FIG. 1 comprise nickel silicide, the blocking layers 180 comprise a different metal silicide. In this particular embodiment the blocking layers 180 comprise cobalt silicide. Nonetheless, other silicidation materials (e.g., nickel, platinum, titanium, tantalum, molybdenum, tungsten, etc.) could be used to form the blocking layers 180 and remain within the scope of the present invention. The blocking layers 180 may have a depth into the source/drain regions 170 ranging from about 10 nm to about 35 nm, among others. This depth needs to be sufficient to prevent the silicidation metal used to form the silicided gate electrode 150 from affecting the source/drain regions 170, however, small enough to be consistent with the design of the present invention.

Figure 2:
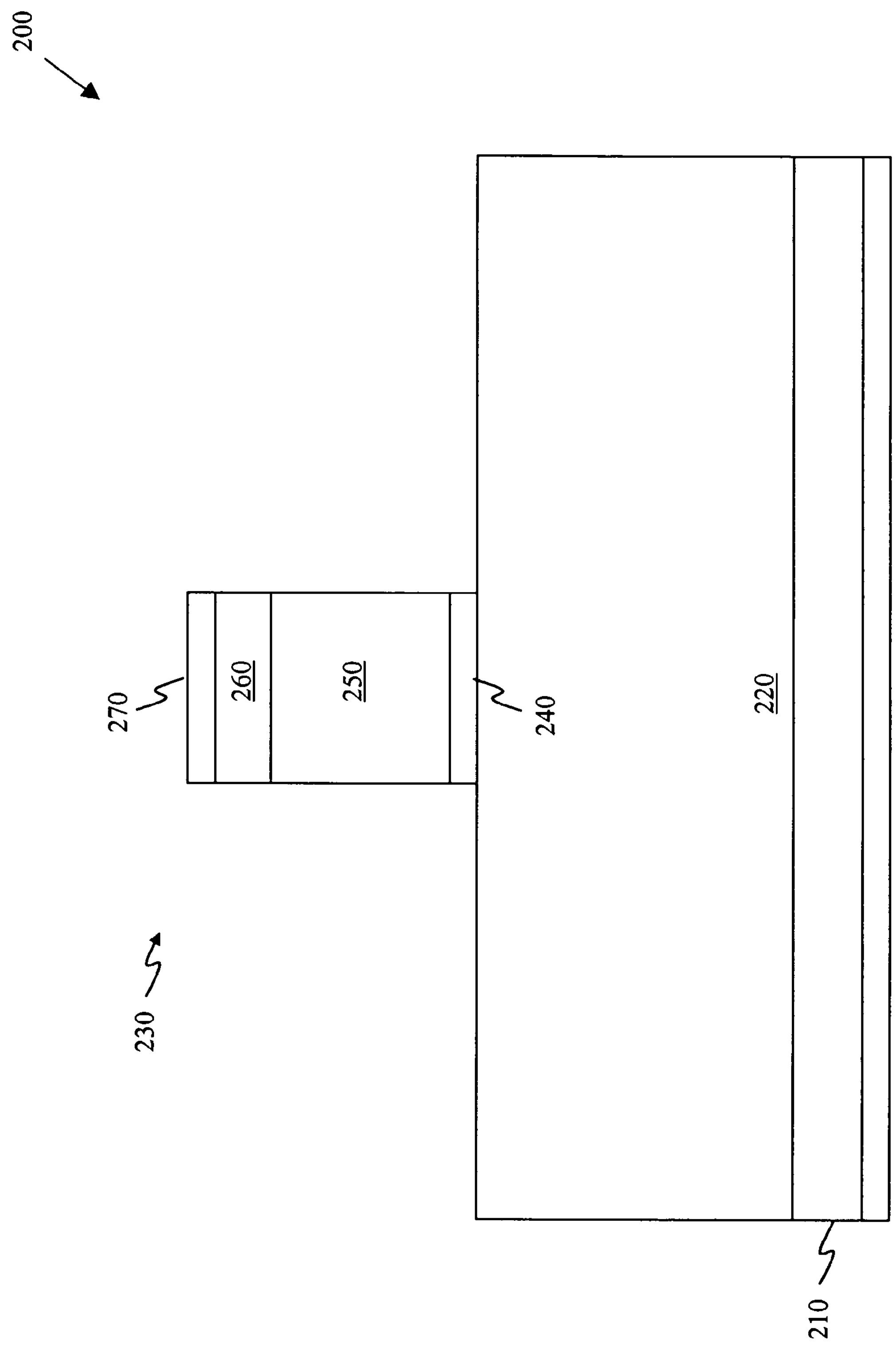
FIG. 2 illustrates a cross-sectional view of a partially completed semiconductor device manufactured in accordance with the principles of the present invention.

Turning now to FIGS. 2-11, illustrated are cross-sectional views of detailed manufacturing steps instructing how one might, in an advantageous embodiment, manufacture a semiconductor device similar to the semiconductor device 100 depicted in FIG. 1. FIG. 2 illustrates a cross-sectional view of a partially completed semiconductor device 200 manufactured in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention. In such a case, each of the dopant types described throughout the remainder of this document would be reversed. For clarity, no further reference to this opposite scheme will be discussed.

Located within the substrate 210 in the embodiment shown in FIG. 2 is a well region 220. The well region 220, in light of the P-type semiconductor substrate 210, would more than likely contain an N-type dopant. For example, the well region 220 would likely be doped with an N-type dopant dose ranging from about 1E13 atoms/cm$^2$ to about 1E14 atoms/cm$^2$ and at an energy ranging from about 100 keV to about 500 keV. This results in the well region 220 having a peak dopant concentration ranging from about 5E17 atoms/cm$^3$ to about 1E19 atoms/cm$^3$.

Located over the substrate 210 in the embodiment of FIG. 2 is a gate structure 230. The gate structure 230 includes a gate oxide 240 and a polysilicon gate electrode 250. The gate oxide 240 may comprise a number of different materials and stay within the scope of the present invention. For example, the gate oxide 240 may comprise silicon dioxide, or in an alternative embodiment comprise a high dielectric constant (K) material. In the illustrative embodiment of FIG. 2, however, the gate oxide 240 is a silicon dioxide layer having a thickness ranging from about 0.5 nm to about 5 nm.

Any one of a plurality of manufacturing techniques could be used to form the gate oxide 240. For example, the gate oxide 240 may be either grown or deposited. Additionally, the growth or deposition steps may require a significant number of different temperatures, pressures, gasses, flow rates, etc.

While the advantageous embodiment of FIG. 2 dictates that the polysilicon gate electrode 250 comprise standard polysilicon, other embodiments exist where the polysilicon gate electrode, or at least a portion thereof, comprises amorphous polysilicon. The amorphous polysilicon embodiment may be particularly useful when a substantially planar upper surface of the polysilicon gate electrode 250 is desired.

The deposition conditions for the polysilicon gate electrode 250 may vary, however, if the polysilicon gate electrode 250 were to comprise standard polysilicon, such as the instance in FIG. 2, the polysilicon gate electrode 250 could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, amorphous polysilicon were desired, the amorphous polysilicon gate electrode could be deposited using a pressure ranging from about 100 torr to about 300 torr, a temperature ranging from about 450° C. to about 550° C., and a $SiH_4$ or $Si_2H_6$ gas flow ranging from about 100 sccm to about 300 sccm. In any instance, the polysilicon gate electrode 250 desirably has a thickness ranging from about 50 nm to about 150 nm.

The partially completed semiconductor device 200 illustrated in FIG. 2 further includes a protective layer 260 located over the polysilicon gate electrode 250. The protective layer 260, which may comprise silicon nitride among other materials, may have a thickness ranging from about 5 nm to about 50 nm. It is desirable for the protective layer 260 to have a thickness small enough to allow a dopant to easily penetrate therethrough, however, large enough to provide the sufficient amount of protection to the polysilicon gate electrode 250.

Optionally located over the protective layer 260 is a silicon dioxide layer 270. The optional silicon dioxide layer 270 is designed to help pattern the gate oxide 240, polysilicon gate electrode 250 and protective layer 260. With that said, those skilled in the art understand that the gate oxide 240, polysilicon gate electrode 250, protective layer 260 and optional silicon dioxide layer 270 were originally blanket deposited. Those blanket layers were subsequently patterned resulting in the gate oxide 240, polysilicon gate electrode 250, protective layer 260 and optional silicon dioxide layer 270 illustrated in FIG. 2. In one embodiment, the polysilicon gate electrode 250 and protective layer 260 are formed using a chemical vapor deposition (CVD) technique.

Figure 3:
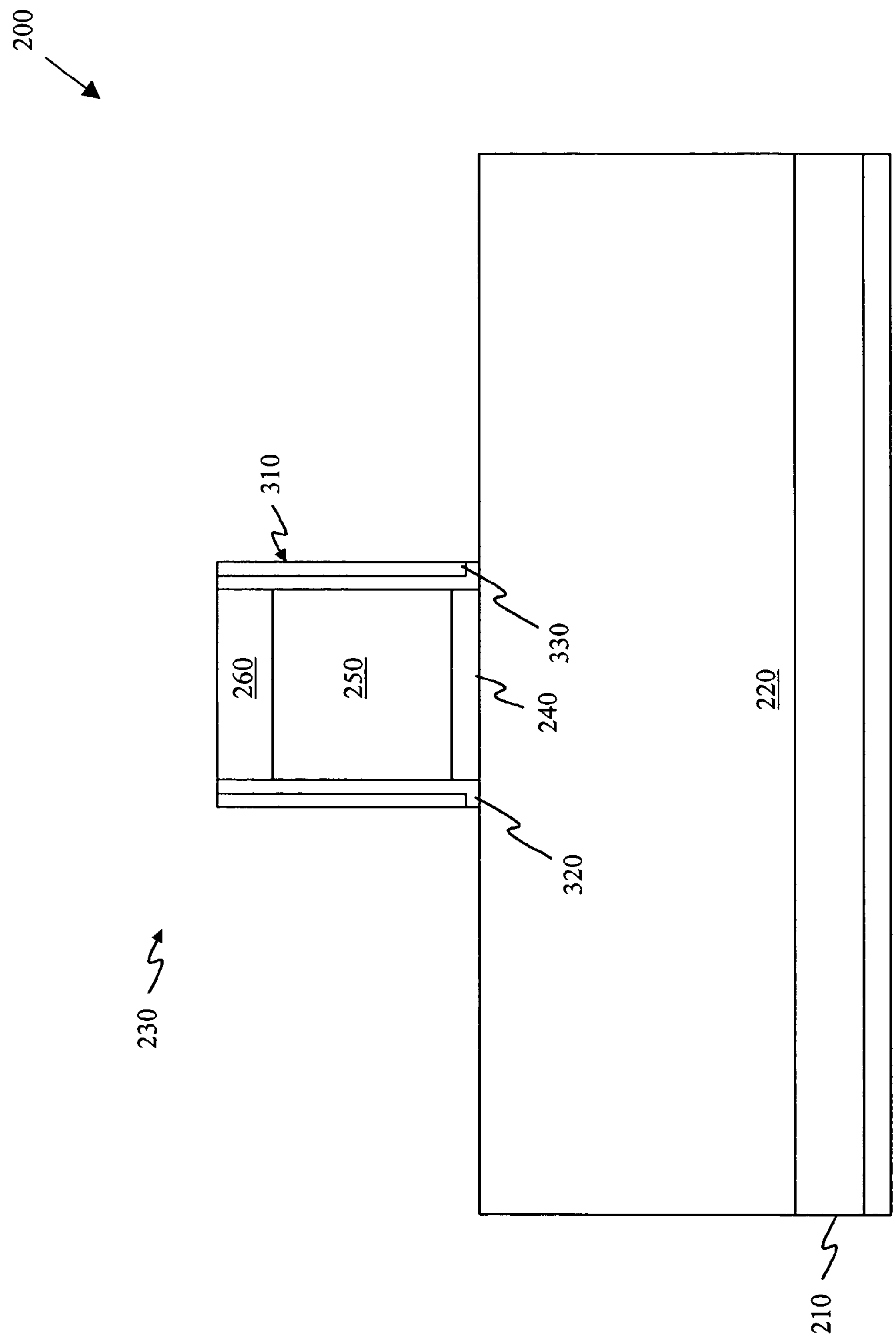
FIG. 3 illustrates a cross-sectional view of the partially completed semiconductor device illustrated in FIG. 2 after formation of a portion of gate sidewall spacers.

Turning briefly to FIG. 3 illustrated is a cross-sectional view of the partially completed semiconductor device 200 illustrated in FIG. 2 after formation of portions of gate sidewall spacers 310. The portions of the gate sidewall spacers 310 shown in FIG. 3 include an oxide layer 320 and an offset nitride spacer 330. The oxide layer 320, as compared to similar layers used in the prior art, is formed at least partially using a deposition process. In an exemplary process the oxide layer 320 is initially formed using a first deposition process, and then finished using a second oxidation process. The first deposition process allows the oxide layer 320 to form on the top and sidewalls of the protective layer 260. In an alternative embodiment the entire oxide layer 320 is deposited.

The offset nitride spacer 330 may comprise a standard silicon nitride spacer or a silicon nitride layer having carbon therein. If the offset nitride spacer 330 were to contain the carbon, the carbon might form from about 5% to about 10% of the layer. While the oxide layer 320 and the offset nitride spacer 330 are shown located only along the sides of the gate structure 230, those skilled in the art are aware that the layers were previously blanket formed and subsequently anisotropically etched to form the oxide layer 320 and the offset nitride spacer 330.

Figure 4:
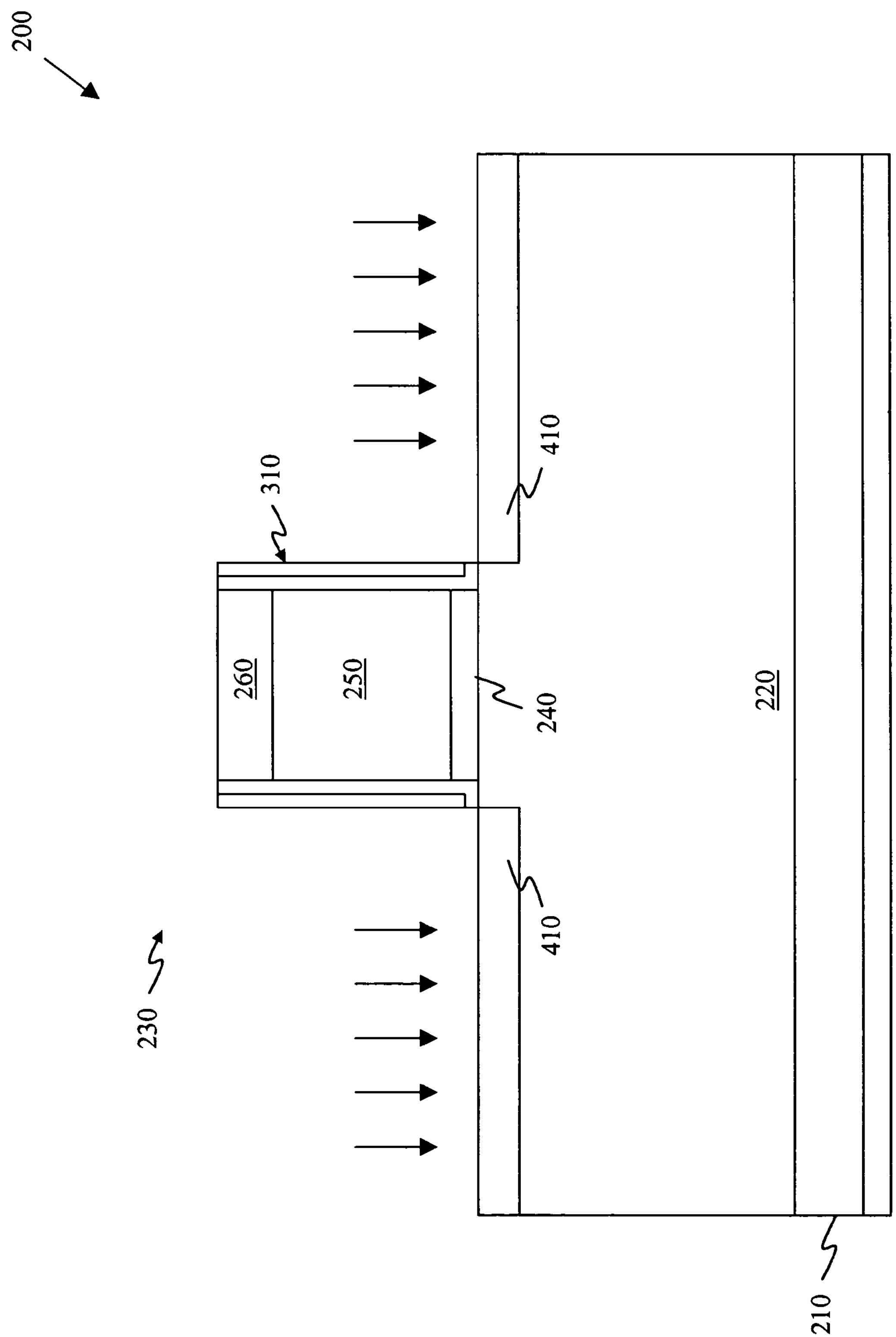
FIG. 4 illustrates a cross-sectional view of the partially completed semiconductor device illustrated in FIG. 3 after formation of lightly doped extension implants within the substrate.

Turning now to FIG. 4, illustrated is a cross-sectional view of the partially completed semiconductor device 200 illustrated in FIG. 3 after formation of lightly doped extension implants 410 within the substrate 210. The lightly doped extension implants 410 are conventionally formed and generally have a peak dopant concentration ranging from about 1E19 atoms/cm$^3$ to about 2E20 atoms/cm$^3$. As is standard in the industry, the lightly doped extension implants 410 have a dopant type opposite to that of the well region 220 they are located within. Accordingly, the lightly doped extension implants 410 are doped with a P-type dopant in the illustrative embodiment shown in FIG. 4.

Figure 5:
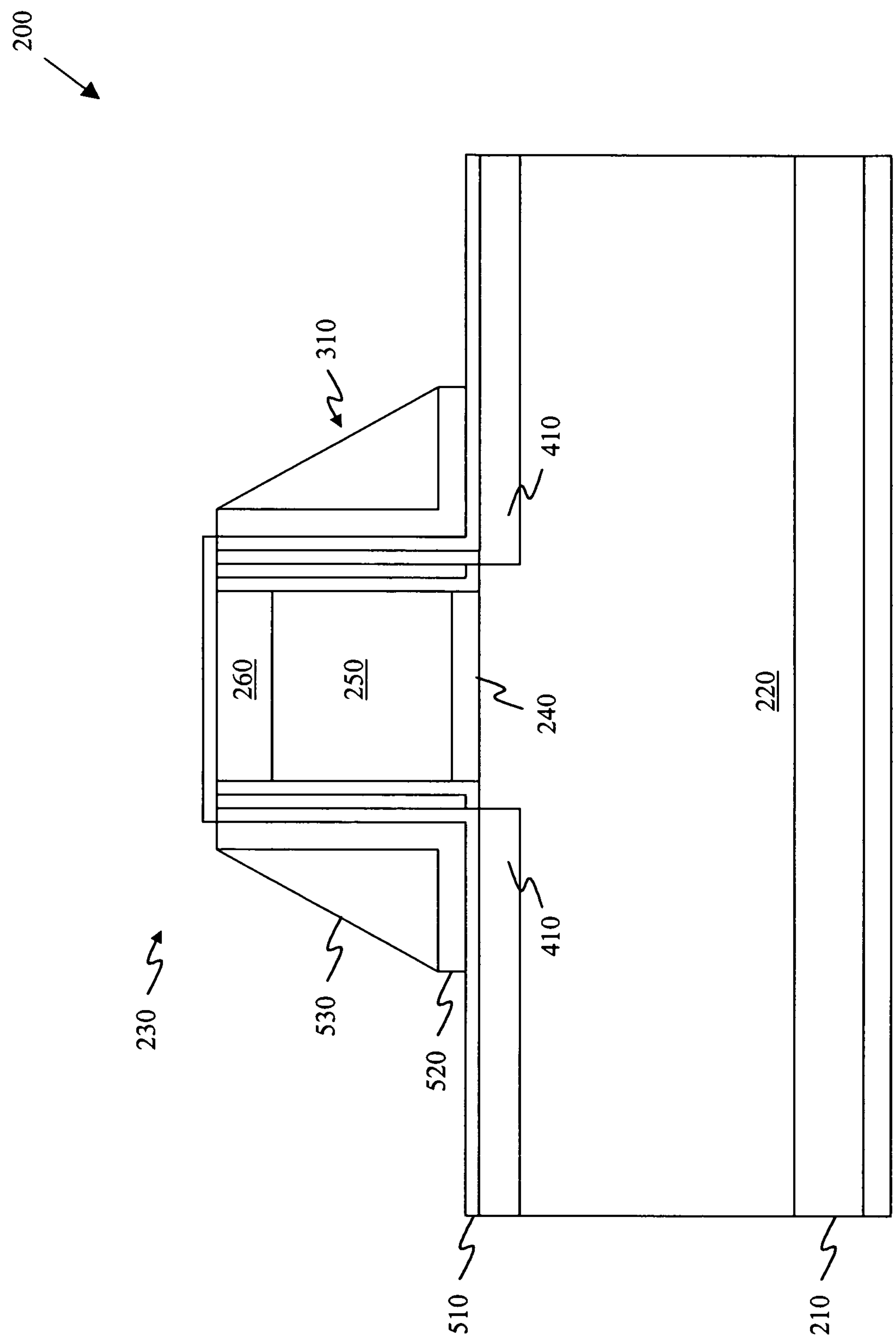
FIG. 5 illustrates a cross-sectional view of the partially completed semiconductor device illustrated in FIG. 4 after forming the remaining portions of the gate sidewall spacers.

Turning now to FIG. 5, illustrated is a cross-sectional view of the partially completed semiconductor device 200 illustrated in FIG. 4 after forming the remaining portions of the gate sidewall spacers 310. Particularly, a cap oxide 510, L-shaped nitride spacers 520 and sidewall oxides 530 complete the gate sidewall spacers 310. The cap oxide 510, among other purposes, has the job of preventing the L-shaped nitride spacers 520 from directly contacting the substrate 210. Most likely, the cap oxide 510 will be deposited over the partially completed semiconductor device 200 using a process similar to that used to form the oxide layer 320.

The L-shaped nitride spacers 520 may comprise any type of nitride, however, in an exemplary embodiment the L-shaped nitride spacers 520 comprise a nitride material that includes carbon. The carbon content, which may range from about 5% to about 10% of the L-shaped nitride spacers 520, is included within the L-shaped nitride spacers 520 to change the rate at which they etch. In the embodiment where the L-shaped nitride spacers 520 include carbon, the L-shaped nitride spacers 520 may be deposited using bis t-butylaminosilane (BTBAS) and ammonia ($NH_3$) precursors in a CVD reactor. Advantageously, the carbon causes the L-shaped nitride spacers 520 to etch at a slower rate than a traditional nitride layer. In an exemplary situation, after having been annealed using a temperature ranging from about 1000° C. to about 1100° C., the carbon causes the L-shaped nitride spacers 520 to have an etch selectivity of about 50:1 when compared to the traditional nitride layer.

The sidewall oxides 530 that are located over the L-shaped nitride spacers 520 are conventional. In the given embodiment of FIG. 5, the sidewall oxides 530 were blanket deposited and then subjected to an anisotropic etch. The resulting sidewall oxides 530 complete the gate sidewall spacers 310 illustrated in the embodiment of FIG. 5.

Figure 6:
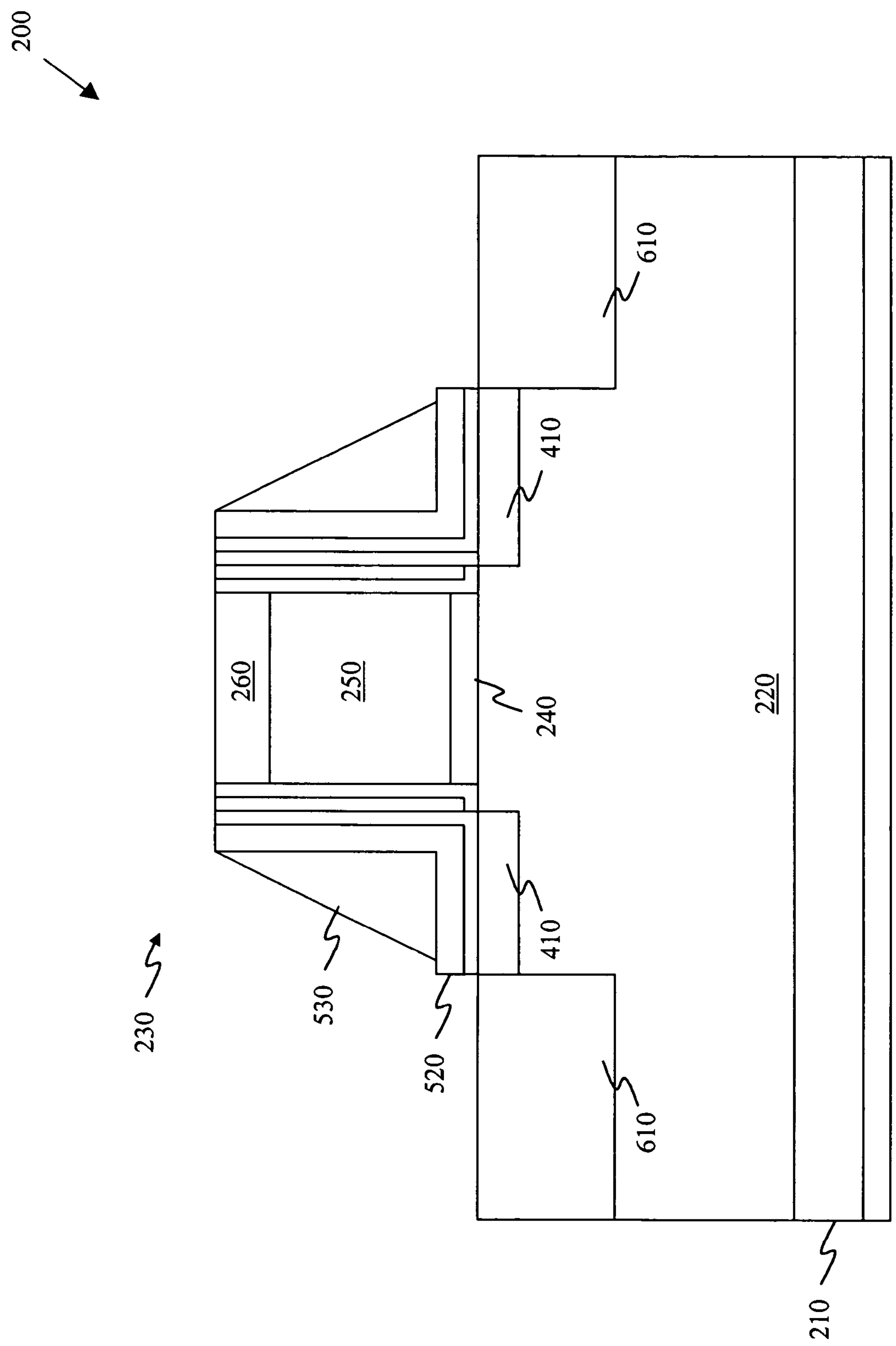
FIG. 6 illustrates a cross-sectional view of the partially completed semiconductor device illustrated in FIG. 5 after etching the cap oxide from the top of the substrate and top of the protective layer, as well as after formation of highly doped source/drain implants within the substrate.

Turning now to FIG. 6, illustrated is a cross-sectional view of the partially completed semiconductor device 200 illustrated in FIG. 5 after etching the cap oxide 510 from the top of the substrate 210 and top of the protective layer 260, as well as after formation of highly doped source/drain implants 610 within the substrate 210. Those skilled in the art understand the conventional processes that could be used to etch the cap oxide 510.

The formation of the highly doped source/drain implants 610 is also conventional. Generally the highly doped source/drain implants 610 have a peak dopant concentration ranging from about 1E18 atoms/$cm^3$ to about 1E21 atoms/$cm^3$. Also, the highly doped source/drain implants 610 should typically have a dopant type opposite to that of the well region 220 they are located within. Accordingly, in the illustrative embodiment shown in FIG. 6, the highly doped source/drain implants 610 are doped with a P-type dopant.

Figure 7:
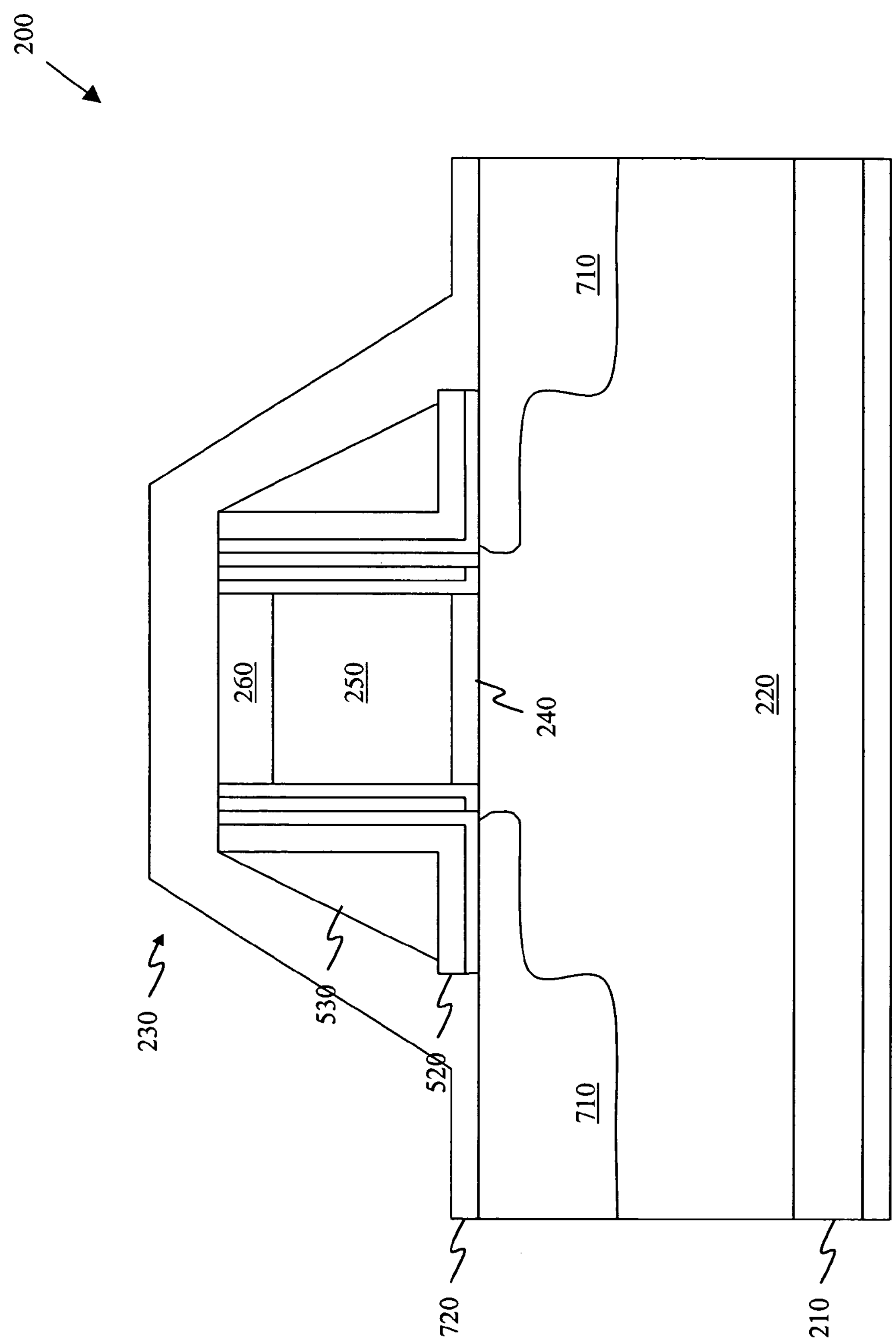
FIG. 7 illustrates a cross-sectional view of the partially completed semiconductor device illustrated in FIG. 6 after subjecting the semiconductor device to a standard source/drain anneal, thereby activating source/drain regions, and after depositing a silicidation metal.

Turning now to FIG. 7, illustrated is a cross-sectional view of the partially completed semiconductor device 200 illustrated in FIG. 6 after subjecting the semiconductor device 200 to a standard source/drain anneal, thereby activating source/drain regions 710. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drain regions 710.

Figure 10:
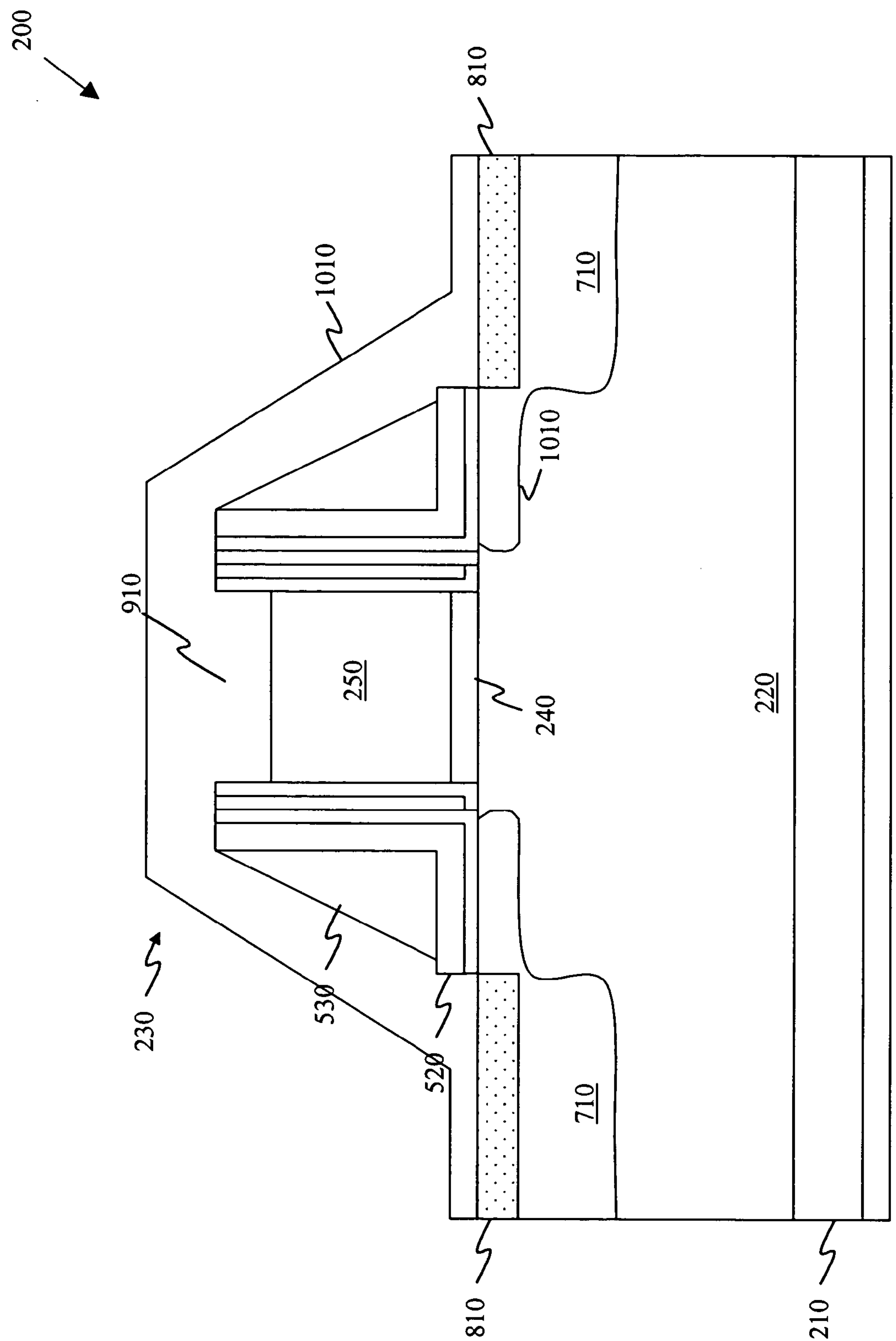
FIG. 10 illustrates a cross-sectional view of the partially completed semiconductor device illustrated in FIG. 9 after depositing a second silicidation metal over the exposed portions of the polysilicon gate electrode, as well as over the remainder of the semiconductor device.

Additionally illustrated in FIG. 7 is the formation of a silicidation metal 720 over the exposed portions of the source/drain regions 710 as well as over the gate structure 230. The silicidation metal 720 in the embodiment shown in FIG. 7 happens to be a thin cobalt layer, however, other materials that react with silicon to form a silicide could easily be used. For instance it is known that the silicidation metal 720 may also comprise nickel, platinum, titanium, tantalum, molybdenum, tungsten, another similar metal, or any combination thereof while staying within the scope of the present invention. In the embodiment of FIG. 7, the silicidation metal 720 comprises a different metal than the silicidation metal 1010 (FIG. 10). Nonetheless, this is not required to remain within the scope of the present invention.

The silicidation metal 720 may be formed using a number of different processes, and may be formed to a number of different thicknesses. In one embodiment of the invention the silicidation metal 720 is deposited to a thickness ranging from about 3 nm to about 10 nm. Such thicknesses, however, might be used when the silicidation metal 720 comprises cobalt. Various other thicknesses could be used if the silicidation metal 720 were to comprise one of the different metals disclosed above.

Figure 8:
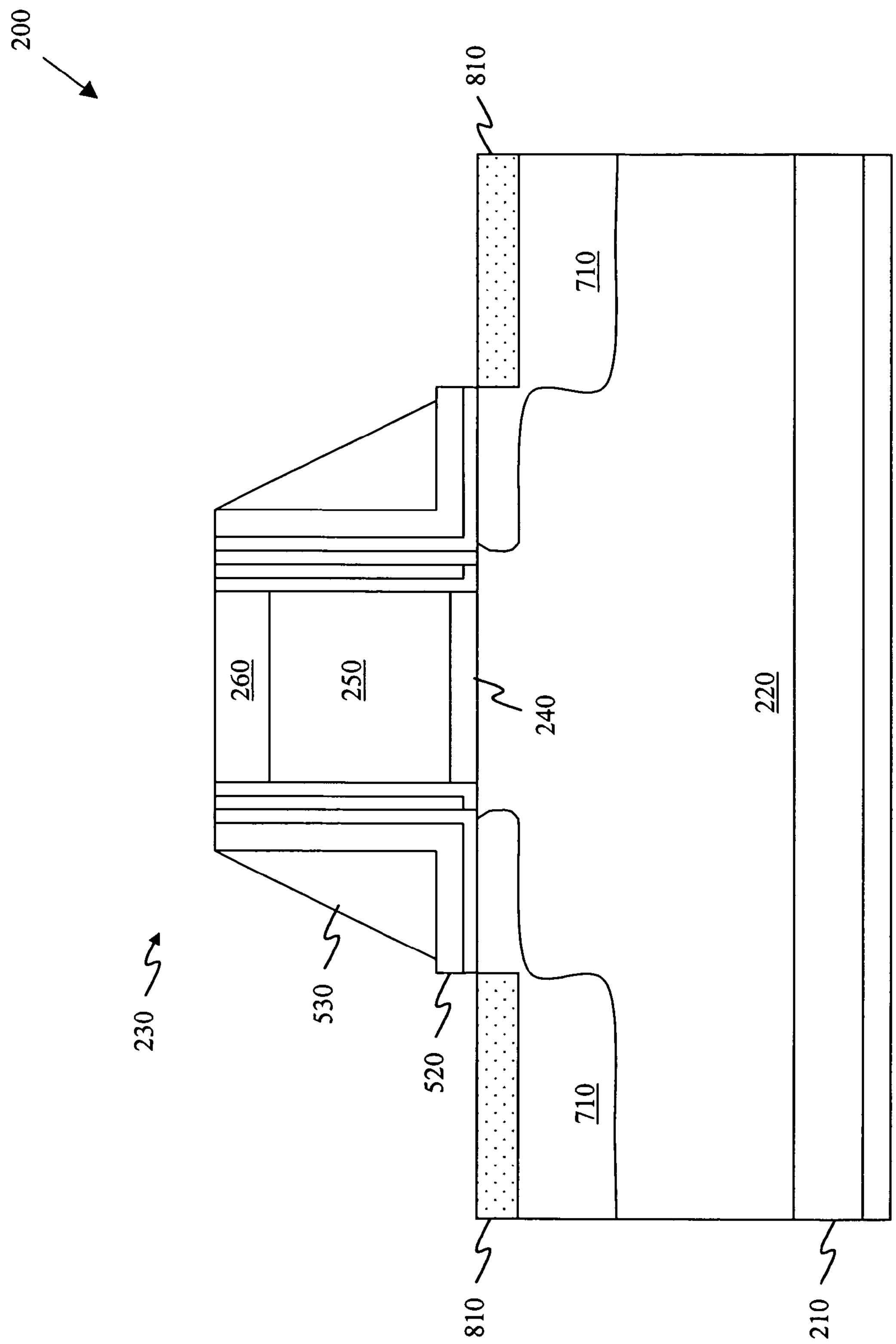
FIG. 8 illustrates a cross-sectional view of the partially completed semiconductor device illustrated in FIG. 7 after subjecting it to a rapid thermal anneal (RTA), and after a selective wet etch to remove un-reacted silicidation metal.

Turning now to FIG. 8, illustrated is a cross-sectional view of the partially completed semiconductor device 200 illustrated in FIG. 7 after subjecting it to a rapid thermal anneal (RTA). This RTA attempts to cause the silicidation metal 720 to react with the silicon of the source/drain regions 710 to form blocking layers 810. In the instance where the silicidation metal 720 comprises cobalt, the RTA causes the cobalt to react with the silicon to form a cobalt silicide.

The RTA may be conducted using a variety of different temperatures and times. Nonetheless, it is believed that the RTA, in an exemplary embodiment, should be conducted in a rapid thermal processing tool at a temperature ranging from about 400° C. to about 600° C. for a time period ranging from about 5 seconds to about 60 seconds. The specific temperature and time period are typically based, however, on the ability to form the blocking layers 810 to a desired depth, as well as the silicide materials selected.

A selective wet etch, using for example a mixture of sulfuric acid ($H_2SO_4$), hydrogen peroxide ($H_2O_2$) and water ($H_2O$), may then be used to remove un-reacted silicidation metal 720 on regions other than exposed silicon, such as on sidewall and gate. Additionally, another optional RTA step may be used to form a low resistivity phase of the silicide. In the case of using cobalt silicidation metal, the first RTA forms CoSi, while the optional RTA forms $CoSi_2$, which has lower resistivity and is more stable. This optional RTA step is typically performed using a temperature ranging from about 650° C. to about 800° C. for a time period ranging from about 5 to about 60 seconds.

Figure 9:
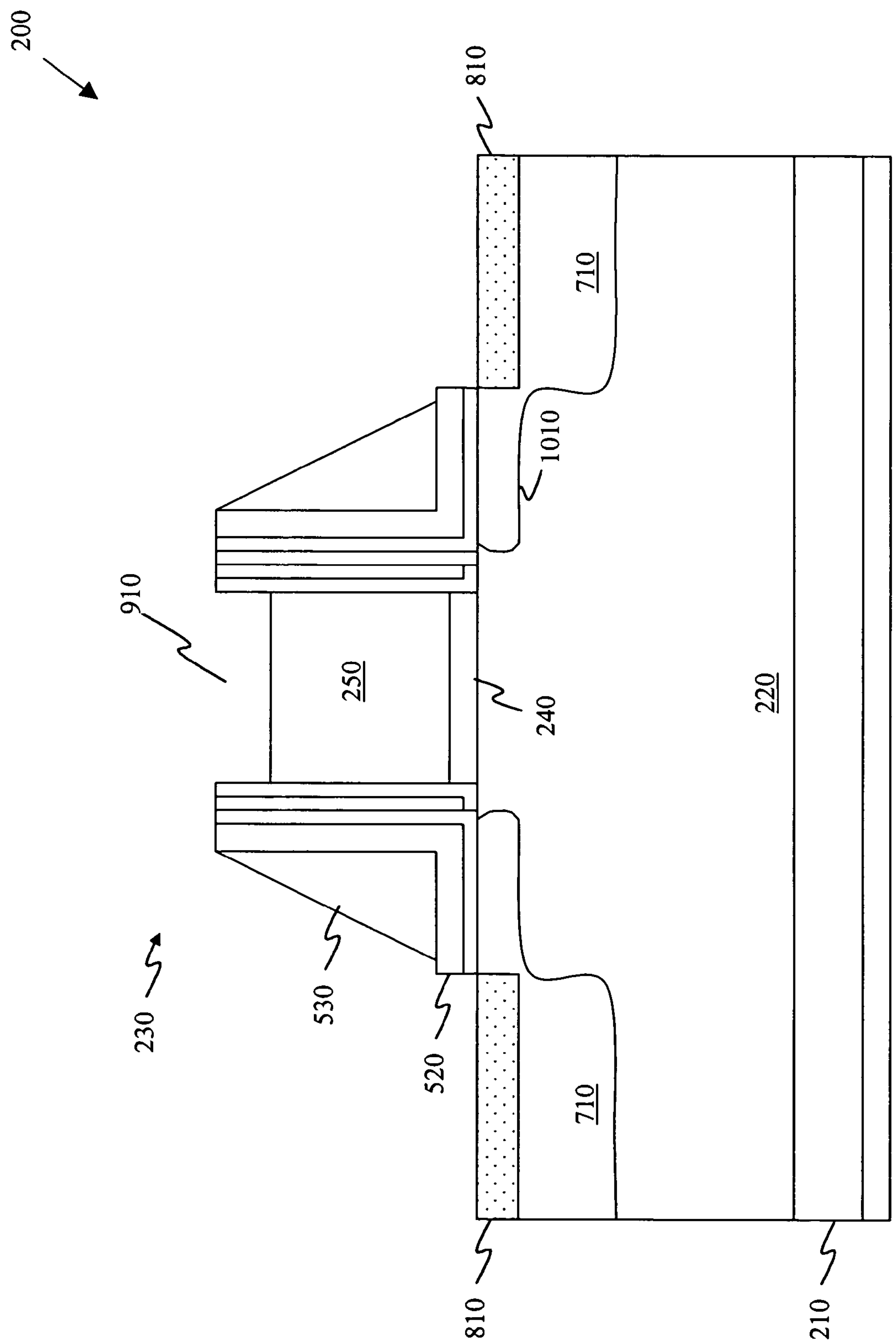
FIG. 9 illustrates a cross-sectional view of the partially completed semiconductor device illustrated in FIG. 8 after removing the protective layer from over the polysilicon gate electrode to form an opening.

Turning now to FIG. 9, illustrated is a cross-sectional view of the partially completed semiconductor device 200 illustrated in FIG. 8 after removing the protective layer 260 from over the polysilicon gate electrode 250 to form an opening 910. Unique to the present invention, the etchant used to remove the protective layer 260 does not substantially affect other structures or films. More specifically, the hot phosphoric acid etchant used to remove the protective layer 260 does not affect the L-shaped nitride spacer 520 and blocking layers 810. Even though the protective layer 260 and the L-shaped nitride spacer 520 both comprise silicon nitride, the carbon content of the L-shaped nitride spacer 520 provides substantial protection from the etchant.

Turning now to FIG. 10, illustrated is a cross-sectional view of the partially completed semiconductor device 200 illustrated in FIG. 9 after depositing a second silicidation metal 1010 over the exposed portions of the polysilicon gate electrode 250, as well as over the remainder of the semiconductor device 200. In a preferred embodiment, the silicidation metal 1010 is designed to fully silicidize the polysilicon gate electrode 250. As it takes approximately 1 nm of nickel to fully silicidize approximately 1.8 nm of polysilicon, the thickness of the silicidation metal 1010 should be at least 56% of the thickness of the polysilicon gate electrode 250. To be comfortable, however, it is suggested that the thickness of the silicidation metal 1010 should be at least 60% of the thickness of the polysilicon gate electrode 250. Thus, where the thickness of the polysilicon gate electrode 250 ranges from about 50 nm to about 150 nm, as described above, the thickness of the silicidation metal 1010 should range from approximately 30 nm to about 90 nm. It should also be noted that the silicidation metal 1010 may comprise a number of different metals or combinations of metals while staying within the scope of the present invention. For example, the silicidation metal 1010 may comprise any metal known to react with polysilicon to form a metal silicide.

In an alternative embodiment of the invention, a thinner layer of silicidation metal 1010 may be formed over the exposed portions of the polysilicon gate electrode 250, as well as over the remainder of the semiconductor device 200. In this instance, the thinner layer of silicidation metal 1010 will only react with the top portion of the polysilicon gate electrode 250, to form a partially silicided gate electrode. The thickness of the thinner layer of silicidation metal 1010 could range from about 3 nm to about 15 nm to only partially silicide the silicided gate electrode. This embodiment is particularly useful for applications where a poly-gate oxide interface is used, rather than a silicide-gate oxide interface, as is the case in the fully silicided gate electrode discussed directly above.

Figure 11:
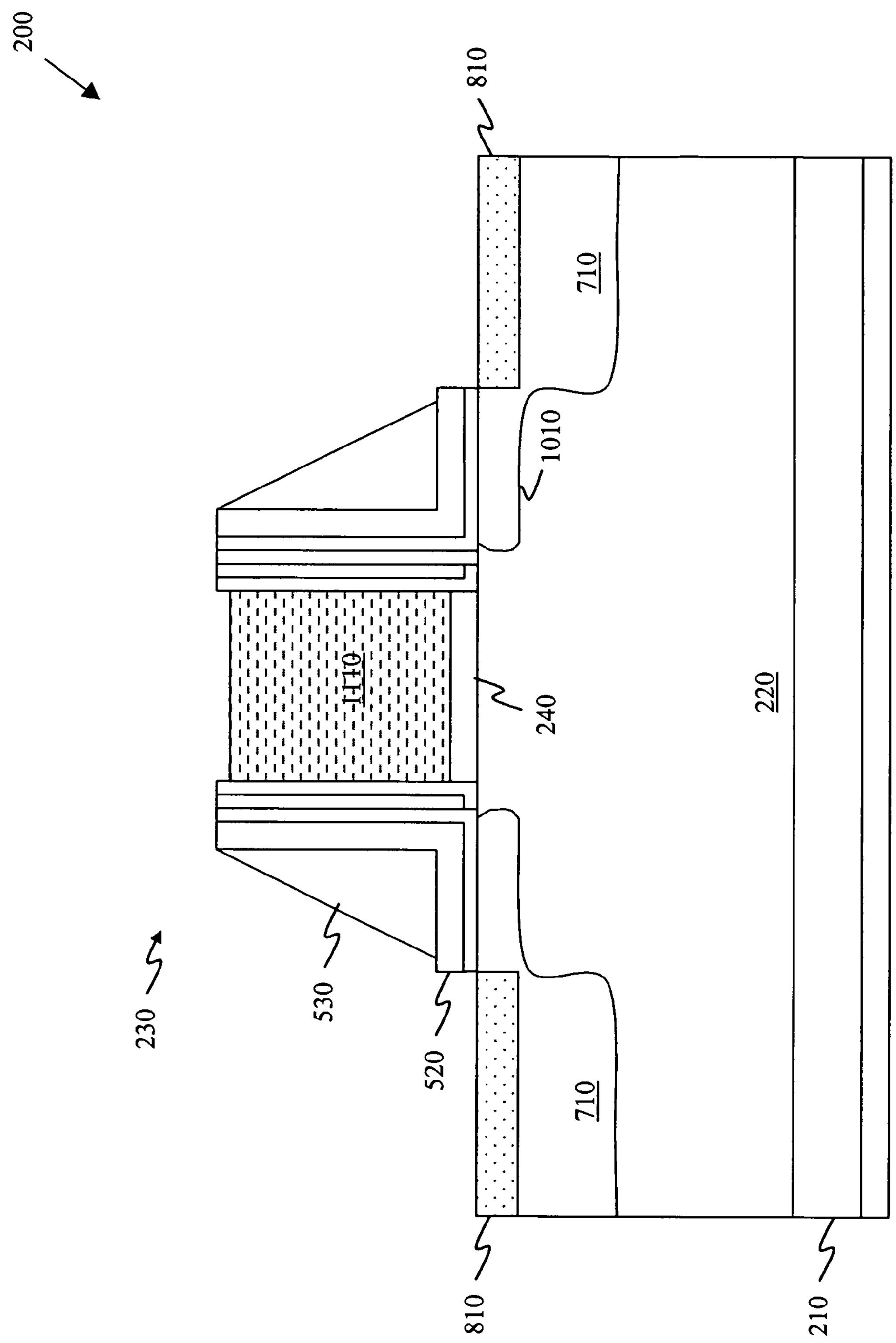
FIG. 11 illustrates a cross-sectional view of the partially completed semiconductor device illustrated in FIG. 10 after converting the polysilicon gate electrode to a silicided gate electrode.

Turning now to FIG. 11, illustrated is the partially completed semiconductor device 200 illustrated in FIG. 10 after converting the polysilicon gate electrode 250 to a silicided gate electrode 1110. Those skilled in the art understand the steps that might be required to form the silicided gate electrode 1110, including subjecting the polysilicon gate electrode 250 and metal silicide layer 1010 to another RTA. This RTA is designed to convert the polysilicon gate electrode 250 to the silicided gate electrode 1110. The annealing temperature depends on the silicide metal being used. For example, it is believed that the RTA may be conducted at a temperature ranging from about 350° C. to about 550° C. and a time period ranging from about 10 second to about 100 seconds to accomplish the silicidation when nickel is used. It should be noted that other temperatures, times, and processes could be used if another metal were used. In a preferred embodiment, the silicidation metal 1010 fully silicidizes the polysilicon gate electrode 250. The silicide, however, does not form on the source/drain region 710 at this time because of the blocking layers 810.

After completing the silicided gate electrode 1110, the partially completed semiconductor device 200 may be subjected to a selective removal process. For instance, in one embodiment of the invention the device could be subjected to an etch recipe consisting of sulfuric acid ($H_2SO_4$), hydrogen peroxide ($H_2O_2$) and water ($H_2O$). This specific etch recipe has a high degree of selectivity and could easily remove any remaining portions of the silicidation metal 1010. Thereafter the manufacture of the partially completed semiconductor device 200 would continue in a conventional manner, optimally resulting in a device similar to the semiconductor device 100 illustrated in FIG. 1. It should be noted that the exact order of the steps illustrated with respect to FIGS. 2-11 may change depending on the process flow. Additionally, various other steps could be added to the description of FIGS. 2-11.

The method of manufacturing the semiconductor device as discussed with respect to FIGS. 2-11 provides many benefits over the prior art methods. First, and possibly most important, it separates the formation of the silicided gate electrode and blocking layers (e.g., silicided source/drain contact regions) into different steps. Advantageously, this allows the depth of the blocking layers (e.g., silicided source/drain contact regions) to be independent of the thickness of the silicided gate electrode. The decoupling of the two steps is achieved by taking advantage of the chemical selectivity of thin films to certain etch chemistries. Accordingly, CMP is not needed as it is in the prior art methods capable of decoupling the steps. As such, the method of the present invention is applicable to devices having different step heights, whether by design or process variation. The CMP technique of the prior art is not capable of accepting such variations in step heights.

Additionally, the method of the present invention allows the blocking layers to also function as the silicided source/drain regions. Accordingly, the present invention requires less processing steps than the prior art options. Further, the method of the present invention allows the semiconductor device to easily choose different silicidation metals for the silicide gate electrode and blocking layers (e.g., silicided source/drain regions). In the embodiment discussed above, the silicided gate electrode benefits from using nickel as the silicidation material. The nickel, at least as compared to cobalt, allows the sheet resistance of the silicided gate electrode to remain small as the gate length continues to increase. Similarly, the blocking layers benefit from using cobalt as the silicidation material. The cobalt, at least as compared to nickel, reduces piping defect issues in the source/drain regions. Thus the embodiment of the method discussed with respect to FIG. 2-11 makes the best use of both nickel and cobalt. It is believed that the other metals would have similar advantages.

Figure 12:
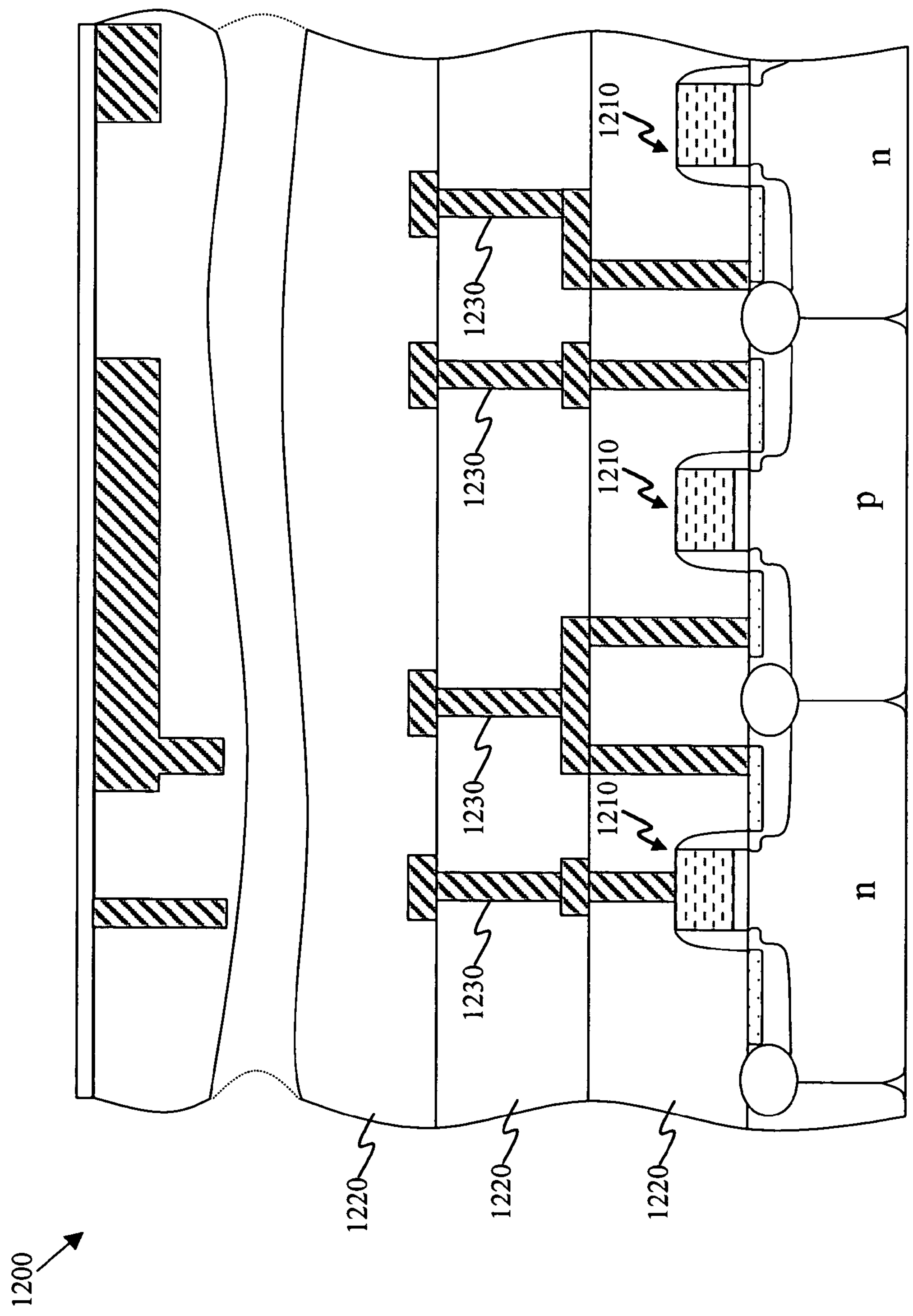
FIG. 12 illustrates an exemplary cross-sectional view of an integrated circuit (IC) incorporating devices constructed according to the principles of the present invention.

Referring now to FIG. 12, illustrated is an exemplary cross-sectional view of an integrated circuit (IC) 1200 incorporating devices 1210 constructed according to the principles of the present invention. The IC 1200 may include devices, such as transistors used to form CMOS devices, BiCMOS devices, Bipolar devices, as well as capacitors or other types of devices. The IC 1200 may further include passive devices, such as inductors or resistors, or it may also include optical devices or optoelectronic devices. Those skilled in the art are familiar with these various types of devices and their manufacture. In the particular embodiment illustrated in FIG. 12, the IC 1200 includes the devices 1210 having dielectric layers 1220 located thereover. Additionally, interconnect structures 1230 are located within the dielectric layers 1220 to interconnect various devices, thus, forming the operational integrated circuit 1200.

Figure 13:
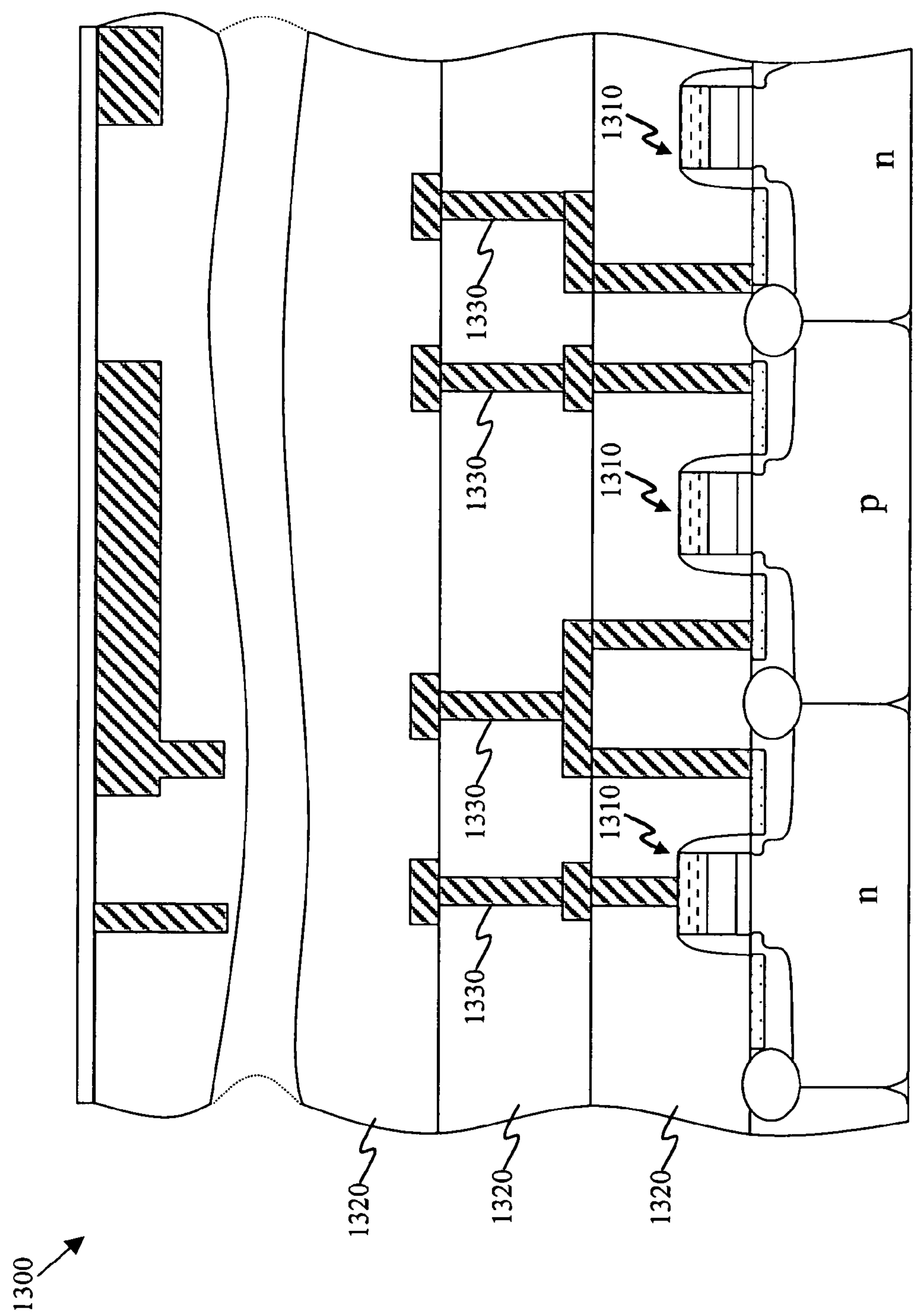
FIG. 13 illustrates another exemplary cross-sectional view of an integrated circuit (IC) incorporating devices constructed according to the principles of the present invention, where the top portion of the poly gate electrode is silicided to form a self-aligned silicide contact.

Referring finally to FIG. 13, illustrated is another exemplary cross-sectional view of an integrated circuit (IC) 1300 incorporating devices 1310 constructed according to the principles of the present invention. In the particular embodiment illustrated in FIG. 13, the IC 1300 includes devices 1310 having a gate electrode that is only partially silicided. The partially silicided gate electrode is desirable to reduce contact resistance of the poly electrode while keeping the poly-gate oxide interface without a silicide forming at the interface. Located over the devices 1310 are dielectric layers 1320. Additionally, interconnect structures 1330 are located within the dielectric layers 1320 to interconnect various devices, thus, forming the operational integrated circuit 1300.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:

forming a gate structure over a substrate, said gate structure including a gate dielectric, a polysilicon gate electrode located over said gate dielectric, and a protective layer located over said polysilicon gate electrode;

forming source/drain regions in said substrate proximate said gate structure;

forming a first silicidation metal in contact with said source/drain regions, said protective layer separating said polysilicon gate electrode from said first silicidation metal;

forming a blocking layer over said source/drain regions from said first silicidation metal, said blocking layer comprising a metal silicide;

removing said protective layer from over said polysilicon gate electrode after forming said blocking layer;

forming a second silicidation metal in contact with said polysilicon gate electrode and in contact with said blocking layer; and siliciding said polysilicon gate electrode using said second silicidation metal to form a silicided gate electrode, said blocking layer protecting said source/drain regions from said siliciding.

2. The method as recited in claim 1 wherein said blocking layer is a silicided source/drain contact region.

3. The method as recited in claim 1 wherein said silicided gate electrode comprises a different metal silicide than said blocking layer.

4. The method as recited in claim 3 wherein said blocking layer comprises a cobalt silicide and said silicided gate electrode comprises a nickel silicide.

5. The method as recited in claim 1 wherein said blocking layer has a thickness ranging from about 10 nm to about 35 nm.

6. The method as recited in claim 1 wherein said protective layer is a silicon nitride protective layer.

7. The method as recited in claim 1 wherein siliciding said polysilicon gate electrode to form a silicided gate electrode includes fully siliciding said polysilicon gate electrode to form a fully silicided gate electrode.

8. A method for manufacturing an integrated circuit, comprising:

forming semiconductor devices over a substrate, including;

forming a gate structure over a substrate, said gate structure including a gate dielectric, a polysilicon gate electrode located over said gate dielectric, and a protective layer located over said polysilicon gate electrode;

forming source/drain regions in said substrate proximate said gate structure;

forming a first silicidation metal in contact with said source/drain regions, said protective layer separating said polysilicon gate electrode from said first silicidation metal;

forming a blocking layer over said source/drain regions from said first silicidation metal, said blocking layer comprising a metal silicide;

removing said protective layer from over said polysilicon gate electrode after forming said blocking layer;

forming a second silicidation metal in contact with said polysilicon gate electrode and in contact with said blocking layer; and siliciding said polysilicon gate electrode using said second silicidation metal to form a silicided gate electrode, said blocking layer protecting said source/drain regions from said siliciding; and forming interconnects within dielectric layers located over said substrate for electrically contacting said semiconductor devices.

9. The method as recited in claim 8 wherein said blocking layer is a silicided source/drain contact region.

10. The method as recited in claim 8 wherein said silicided gate electrode comprises a different metal silicide than said blocking layer.

11. The method as recited in claim 10 wherein said blocking layer comprises a cobalt silicide and said silicided gate electrode comprises a nickel silicide.

12. The method as recited in claim 8 wherein said blocking layer has a thickness ranging from about 10 nm to about 35 nm.

13. The method as recited in claim 8 wherein said protective layer is a silicon nitride protective layer.

14. The method as recited in claim 8 wherein siliciding said polysilicon gate electrode to form a silicided gate electrode includes fully siliciding said polysilicon gate electrode to form a fully silicided gate electrode.

15. The method as recited in claim 1 wherein siliciding said polysilicon gate electrode to form said silicided gate electrode occurs prior to siliciding any portion of the polysilicon gate electrode.

16. The method as recited in claim 8 wherein siliciding said polysilicon gate electrode to form said silicided gate electrode occurs prior to siliciding any portion of the polysilicon gate electrode.

* * * * *